(12) United States Patent
Hirata et al.

(10) Patent No.: US 12,266,626 B2
(45) Date of Patent: Apr. 1, 2025

(54) RADAR DEVICE

(71) Applicant: DENSO CORPORATION, Kariya (JP)

(72) Inventors: Shuji Hirata, Kariya (JP); Akira Shintai, Kariya (JP); Atsushi Munaoka, Kariya (JP); Masahiro Matsunoshita, Kariya (JP); Yusuke Tainaka, Kariya (JP)

(73) Assignee: DENSO CORPORATION, Kariya (JP)

( * ) Notice: Subject to any disclaimer, the term of this patent is extended or adjusted under 35 U.S.C. 154(b) by 505 days.

(21) Appl. No.: 17/826,418

(22) Filed: May 27, 2022

(65) Prior Publication Data

US 2022/0285308 A1 Sep. 8, 2022

Related U.S. Application Data

(63) Continuation of application No. PCT/JP2020/040344, filed on Oct. 28, 2020.

(30) Foreign Application Priority Data

Nov. 29, 2019 (JP) ................................. 2019-215960

(51) Int. Cl.
*H01L 23/00* (2006.01)
*G01S 7/03* (2006.01)
(Continued)

(52) U.S. Cl.
CPC ................ *H01L 24/32* (2013.01); *G01S 7/03* (2013.01); *G01S 13/931* (2013.01);
(Continued)

(58) Field of Classification Search
CPC ......... H01L 24/32; H01L 23/66; G01S 7/032; G01S 7/03
See application file for complete search history.

(56) References Cited

U.S. PATENT DOCUMENTS 9,978,707 B1 * 5/2018 Zimmerman ......... H01L 21/563
2014/0091885 A1 4/2014 Shiozaki et al.
(Continued)

FOREIGN PATENT DOCUMENTS

JP 2000298352 A 10/2000
JP 2005064159 A 3/2005
(Continued)

*Primary Examiner* — Erik Kielin
(74) *Attorney, Agent, or Firm* — Harness, Dickey & Pierce, P.L.C.

(57) ABSTRACT

A radar device includes: a substrate including multiple high-frequency conductor layers arranged on a front surface; a semiconductor component in contact with the high-frequency conductor layers via conductive members; and an adhesive that bonds the semiconductor component to the front surface of the substrate. The semiconductor component has a bottom surface and a first side surface facing in a first direction. All the multiple high-frequency conductor layers include at least high-frequency conductor layers bending in a plane of the front surface and thereby extend, on the front surface, from inside ends facing the bottom surface to outside ends positioned in the first direction from the first side surface. The adhesive is in contact with the front surface except for the sites of the multiple high-frequency conductor layers formed and in contact with the side surfaces of the semiconductor component.

14 Claims, 10 Drawing Sheets

(51) Int. Cl.
  *G01S 13/931* (2020.01)
  *H01L 23/31* (2006.01)
  *H01L 23/498* (2006.01)
  *H01Q 1/38* (2006.01)

(52) U.S. Cl.
  CPC .... *H01L 23/3107* (2013.01); *H01L 23/49838* (2013.01); *H01L 24/73* (2013.01); *H01L 2224/32058* (2013.01); *H01L 2224/32225* (2013.01); *H01L 2224/73203* (2013.01); *H01Q 1/38* (2013.01)

(56) References Cited

U.S. PATENT DOCUMENTS

2014/0151860 A1* 6/2014 Nakamura ........... H01Q 9/0407
  257/664
2019/0198455 A1 6/2019 Hartner et al.

FOREIGN PATENT DOCUMENTS

| JP | 2009188297 A | | 8/2009 | |
|---|---|---|---|---|
| JP | 2016163216 A | * | 9/2016 | ............. G01S 7/02 |
| JP | 3221210 U | | 5/2019 | |
| WO | WO-2013027409 A1 | | 2/2013 | |

* cited by examiner

RADAR DEVICE

CROSS-REFERENCE TO RELATED APPLICATION

This application is the U.S. bypass application of International Application No. PCT/JP2020/040344 filed on Oct. 28, 2020 which designated the U.S. and claims priority to Japanese Patent Application No. 2019-215960 filed on Nov. 29, 2019, the contents of both of which are incorporated herein by reference.

TECHNICAL FIELD

The present disclosure relates to a radar device.

BACKGROUND

A radar device is used to, using high frequency radar, determine the presence or absence of any object within the radar coverage. For example, a radar device is used to detect the presence of another vehicle ahead of the user's vehicle or the distance between the user's vehicle and the other vehicle.

SUMMARY

An aspect of the present disclosure provides a radar device including a substrate including a plurality of conductor layers arranged on a front surface or a rear surface, the conductor layers including a plurality of high-frequency conductor layers for transferring a high frequency signal, a semiconductor component that faces the front surface of the substrate, is in contact with the plurality of conductor layers on the substrate via conductive members and generates a high frequency signal, and an adhesive that bonds the semiconductor component to the front surface of the substrate.

The semiconductor component has a bottom surface and a plurality of side surfaces including a first side surface facing in a first direction from a central portion to an edge in a plane of the front surface or the rear surface. All the plurality of high-frequency conductor layers or a high-frequency conductor layer set included in the plurality of high-frequency conductor layers includes at least high-frequency conductor layers that bend in the plane of the front surface or the rear surface and thereby extends, on the front surface or the rear surface, from inside ends facing the bottom surface to outside ends positioned in the first direction from the first side surface.

The adhesive is in contact with the front surface except for the sites of the plurality of high-frequency conductor layers formed and in contact with the side surfaces of the semiconductor component.

BRIEF DESCRIPTION OF THE DRAWINGS

The above features of the present disclosure will be made clearer by the following detailed description, given referring to the appended drawings. In the accompanying drawings.

DETAILED DESCRIPTION OF THE PREFERRED EMBODIMENTS

Figure 1:
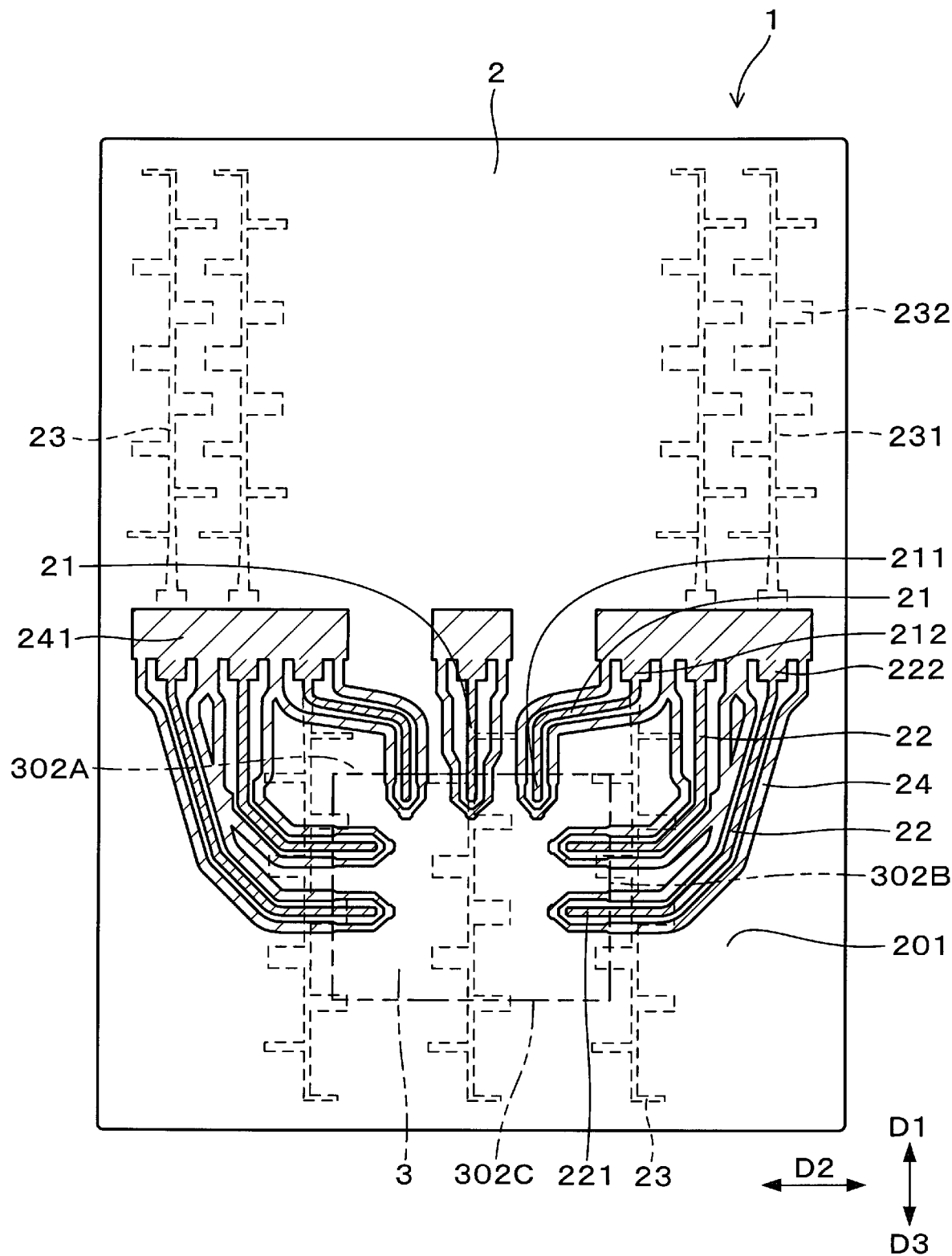
FIG. 1 is a plan view of a radar device according to a first embodiment, showing the front surface of its substrate.

A radar device includes a semiconductor component disposed to face the front surface of an insulating substrate. On the front surface of the substrate, multiple high-frequency conductor layers for transferring high frequency signals are provided in a manner electrically connected to the semiconductor component. The semiconductor component is connected with solder to conductor layers including the high-frequency conductor layers. In addition, the semiconductor component and the substrate are bonded together with adhesive to prevent the semiconductor component from being displaced relative to the substrate due to a temperature change.

For example, JP Utility Model Registration No. 3221210 (JP 3221210 U) describes a semiconductor device including high frequency conductive elements. In the semiconductor device, a semiconductor package and a base are connected via the high frequency conductive elements and connection elements, and the semiconductor package and the base are fixed with an underfill material. The high frequency conductive elements and the underfill material are positioned without overlapping each other in a state for orthogonal projection onto the main surface of the base.

In the semiconductor device described in JP 3221210 U, high-frequency conductor layers for transferring high frequency signals are disposed over the base in a manner not particularly advantageous in the positional relationship with the underfill material serving as an adhesive.

When the high-frequency conductor layers, which transfer high frequency signals, are formed to have a greater length, the signal strength may decrease. Thus, to prevent easy attenuation of high frequency signals, the high-frequency conductor layers may be formed to have the smallest possible length. In addition, as described in JP 3221210 U, to reduce attenuation of high frequency signals, the underfill material may be out of contact with the high frequency conductive elements. To form shorter high-frequency conductor layers, the high-frequency conductor layers may be distributed around the semiconductor component over the substrate (base). However, for the radar device in this case, an antenna layer connected to the high-frequency conductor layers may account for a higher proportion, increasing the overall size of the radar device. The limited space for the radar device has caused a demand for reductions in the overall size of the device.

In JP 3221210 U, the semiconductor package as the semiconductor component is fixed to the base by adhering the bottom surface of the semiconductor package to the surface of the base with the underfill material. However, the semiconductor device includes a variety of components such as the base, the semiconductor package, the high frequency conductive elements, the connection elements, and the underfill material, with these components having different linear expansion coefficients. Thus, for example, a temperature increase may cause different thermal stresses applied to the components, displacing the semiconductor package relative to the substrate in a direction parallel to the surface of the substrate. As a result, cracking may occur in the high frequency conductive elements, the connection elements, or other components.

In order to reduce attenuation of high frequency signals, the size of the device, and thermal stress cracking, the high-frequency conductor layers and the adhesive are to be arranged relative to the semiconductor component in a further improved manner.

The present disclosure is intended to provide a radar device that allows appropriate arrangement of the high-frequency conductor layers and the adhesive relative to the semiconductor component in order to reduce attenuation of high frequency signals, the size of the device, and thermal stress cracking.

An aspect of the present disclosure provides a radar device including a substrate including a plurality of conductor layers arranged on a front surface or a rear surface, the conductor layers including a plurality of high-frequency conductor layers for transferring a high frequency signal, a semiconductor component that faces the front surface of the substrate, is in contact with the plurality of conductor layers on the substrate via conductive members and generates a high frequency signal, and an adhesive that bonds the semiconductor component to the front surface of the substrate.

The semiconductor component has a bottom surface and a plurality of side surfaces including a first side surface facing in a first direction from a central portion to an edge in a plane of the front surface or the rear surface. All the plurality of high-frequency conductor layers or a high-frequency conductor layer set included in the plurality of high-frequency conductor layers includes at least high-frequency conductor layers that bend in the plane of the front surface or the rear surface and thereby extends, on the front surface or the rear surface, from inside ends facing the bottom surface to outside ends positioned in the first direction from the first side surface.

The adhesive is in contact with the front surface except for the sites of the plurality of high-frequency conductor layers formed and in contact with the side surfaces of the semiconductor component.

In the radar device, the high-frequency conductor layers and the adhesive are arranged relative to the semiconductor components in an advantageous manner.

Specifically, the plurality of overall high-frequency conductor layers or the high-frequency conductor layer set includes at least high-frequency conductor layers that bend in the plane of the front surface of the substrate. As a result, the outside ends of the plurality of overall high-frequency conductor layers or the high-frequency conductor layer set are positioned in the first direction from the first side surface of the semiconductor component. The arrangement allows attenuation of high frequency signals to be reduced by minimizing the length of the high-frequency conductor layers formed, and allows the size of the device to be reduced by collecting the high-frequency conductor layers to the extent possible.

The adhesive is in contact with the front surface of the substrate and the side surfaces of the semiconductor component except for the sites of the plurality of high-frequency conductor layers formed. This arrangement enables the adhesive to hold the side surfaces of the semiconductor component even when the semiconductor component is affected by thermal stresses due to the differences between the linear expansion coefficients of the components such as the substrate, the conductor layers, the semiconductor component, the conductive members, and the adhesive. Thus, the semiconductor component cannot be displaced relative to the substrate in a direction parallel to the front surface of the substrate, preventing cracking from occurring in, for example, the conductive members.

Accordingly, the above radar device allows appropriate arrangement of the high-frequency conductor layers and the adhesive relative to the semiconductor component in order to reduce attenuation of high frequency signals, the size of the device, and thermal stress cracking.

Preferred embodiments of the above-described radar device will now be described with reference to the drawings.

First Embodiment

A radar device 1 according to this embodiment, as shown in FIGS. 1 to 5, includes a substrate 2, a semiconductor component 3, and an adhesive 4. The substrate 2 has a front surface 201 on which multiple conductor layers 20, 21, and 22 are arranged, and the multiple high-frequency conductor layers 21 and 22 of the conductor layers transfer high frequency signals. The semiconductor component 3 faces the front surface 201 of the substrate 2, connects to the multiple conductor layers 20, 21, and 22 on the substrate 2 with conductive members 35, and generates high frequency signals. The adhesive 4 bonds the semiconductor component 3 to the front surface 201 of the substrate 2.

The semiconductor component 3 has a bottom surface 301 and multiple side surfaces 302A, 302B, and 302C, with the first side surface 302A facing in a first direction D1 from a central portion to an edge in a plane of the front surface 201. All the multiple high-frequency conductor layers 21 and 22 include at least high-frequency conductor layers bending in a plane of the front surface 201 and thereby extend, on the front surface 201, from inside ends 211 and 221 facing the bottom surface 301 to outside ends 212 and 222 positioned in the first direction D1 from the first side surface 302A. The adhesive 4 is in contact with the front surface 201 except for the sites of the multiple high-frequency conductor layers 21 and 22 formed and in contact with the side surfaces 302A, 302B, and 302C of the semiconductor component 3.

The radar device 1 according to the present embodiment will now be described in detail.

[Radar Device 1]

The radar device 1 is used to, by high frequency radar, determine the presence or absence of any object within the radar coverage. The radar device 1 according to the present embodiment is provided on a vehicle and used to detect the presence of another vehicle ahead of the user's vehicle or the distance between the user's vehicle and the other vehicle. The radar device 1 includes a millimeter-wave radar that uses millimeter waves in the frequency band of 30 to 300 GHz. The high frequency waves may have frequencies from 3 MHz to 300 GHz.

The radar device 1 is installed on the front of a vehicle. More specifically, the radar device 1 is installed behind the emblem provided on, for example, the radiator grille at the front of the vehicle. In the present embodiment, the radar device 1 has been installed on a vehicle. The radar device 1 is also used for an on-vehicle radar monitoring system. The radar monitoring system uses an on-vehicle control device to detect an object by high frequency radar.

In the radar device 1, one direction extending in a plane of the front surface 201 of the substrate 2 from a central portion to an edge of the substrate 2 is referred to as the first direction D1. The first direction D1 is determined as a direction orthogonal to one side of the substantially rectangular substrate 2. In the plane of the front surface 201 of the substrate 2, the directions at right angles to the first direction D1 are referred to as second directions D2. The second directions D2 refer to opposite directions at right angles to the first direction D1.

In the plane of the front surface 201 of the substrate 2, the direction opposite to the first direction D1 is referred to as a third direction D3. The direction in which the semiconductor component 3 and the substrate 2 face each other, or the direction at right angles to the planes of the front surface 201 of the substrate 2 and its rear surface 202, is referred to as a height direction H. Of the semiconductor component 3, the side surface facing in the first direction D1 is referred to as the first side surface 302A. Of the semiconductor component 3, the pair of side surfaces aligned in the second directions D2 is referred to as the second side surfaces 302B. Of the semiconductor component 3, the side surface facing in the third direction D3 is referred to as the third side surface 302C.

[Substrate 2]

Figure 3:
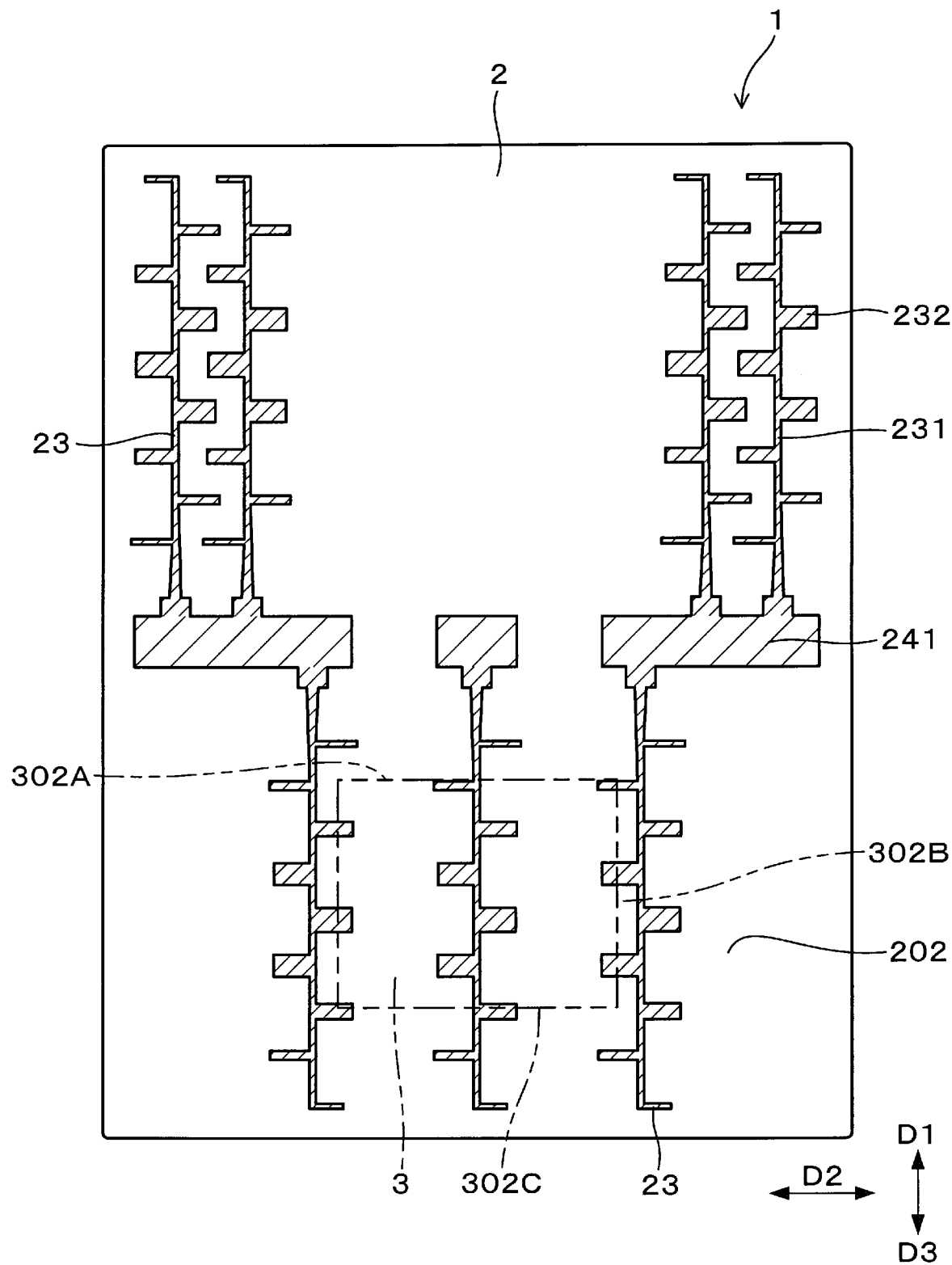
FIG. 3 is a plan view of antenna conductor layers in the radar device according to the first embodiment, showing the rear surface of the substrate.

As shown in FIGS. 1 and 3, the substrate 2 includes an insulating substrate body 200, the multiple conductor layers 20, 21, and 22 provided on the front surface 201 of the substrate body 200, and antenna conductor layers 23 provided on the rear surface 202 of the substrate body 200. FIG. 1 illustrates the front surface 201 of the substrate 2, whereas FIG. 3 illustrates the rear surface 202 of the substrate 2. The substrate body 200 is a flat base. The front surface 201 and the rear surface 202 are formed as main surfaces occupying the largest area of the substrate body 200. The antenna conductor layers 23 are connected to the high-frequency conductor layers 21 and 22 of the multiple conductor layers 20, 21, and 22.

[Antenna Conductor Layers 23]

As shown in FIGS. 1 and 3, the antenna conductor layers 23 form antennas for transmitting or receiving high frequency signals. The antenna conductor layers 23 include transmission antenna conductor layers 23 for transmitting modulated waves (high frequency waves) generated in the semiconductor component 3 to an object as transmission waves, and reception antenna conductor layers 23 for receiving waves transmitted from the transmission antennas and reflected from an object, as reception waves. Some of the high-frequency conductor layers 21 and 22 are connected to the transmission antenna conductor layers 23, and others are connected to the reception antenna conductor layers 23. The antenna conductor layers 23 in this embodiment are provided on the rear surface 202 of the substrate 2. Any of the antenna conductor layers 23 may be the transmission antenna conductor layers 23 or the reception antenna conductor layers 23, and the transmission antenna conductor layers 23 and the reception antenna conductor layers 23 are denoted by the same reference numeral.

[High-Frequency Conductor Layers 21, 22]

Figure 2:
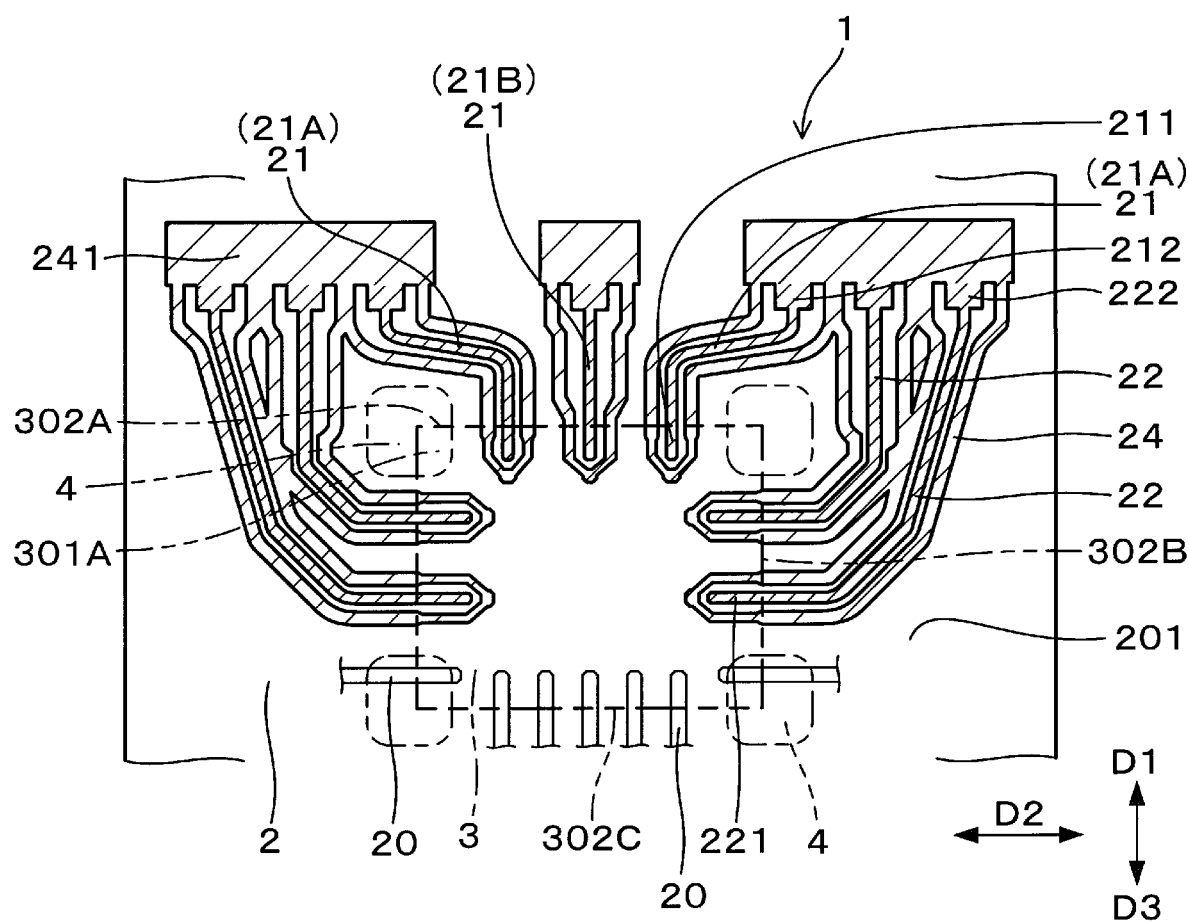
FIG. 2 is a plan view of an area including a semiconductor component and high-frequency conductor layers in the radar device according to the first embodiment, showing the front surface of the substrate.

As shown in FIG. 2, the high-frequency conductor layers 21 and 22 are conductor layers used to transfer high frequency signals. The conductor layers 20, 21, and 22, which include the high-frequency conductor layers 21 and 22, are composed of copper foil provided on the front surface 201 of the substrate 2. Some of the high-frequency conductor layers 21 and 22 in this embodiment transfer high frequency signals from the semiconductor component 3 to the transmission antenna conductor layers 23, and others transfer high frequency signals from the reception antenna conductor layers 23 to the semiconductor component 3. The inside ends 211 and 221 of the high-frequency conductor layers 21 and 22 refer to the end portions of the high-frequency conductor layers 21 and 22 that face the bottom surface 301 of the semiconductor component 3. The outside ends 212 and 222 of the high-frequency conductor layers 21 and 22 refer to the end portions opposite to the inside ends 211 and 221 of the high-frequency conductor layers 21 and 22 and apart from the semiconductor component 3.

As shown in FIGS. 1 and 2, all the high-frequency conductor layers 21 and 22 on the substrate 2 are positioned in the first direction D1 from the semiconductor component 3. The multiple high-frequency conductor layers 21 and 22 are composed of multiple first high-frequency conductor layers 21 extending in the first direction D1 from the first side surface 302A of the semiconductor component 3, and multiple second high-frequency conductor layers 22 extending outward in the second directions D2 from the pair of second side surfaces 302B, which is at right angles to the first side surface 302A of the semiconductor component 3, and bending in the first direction D1. The multiple second high-frequency conductor layers 22 are arranged at both sides in the second direction D2 with the multiple first high-frequency conductor layers 21 interposed between the sides. The outside ends 212 and 222 of all the first high-frequency conductor layers 21 and the second high-frequency conductor layers 22 are positioned in the first direction D1 from the first side surface 302A of the semiconductor component 3.

This arrangement, in which the high-frequency conductor layers 21 and 22 are collected in the first direction D1, enables a reduction in the size of the device.

As shown in FIG. 3, any of the multiple first high-frequency conductor layers 21 and the multiple second high-frequency conductor layers 22 may be connected to the transmission antenna conductor layers 23 or connected to the reception antenna conductor layers 23. The antenna conductor layers 23 connected to the first high-frequency conductor layers 21 in this embodiment extend from the first high-frequency conductor layers 21 in the third direction D3, which is opposite to the first direction D1. The antenna conductor layers 23 connected to the second high-frequency conductor layers 22 in this embodiment extend from the second high-frequency conductor layers 22 in the first direction D1. Each antenna conductor layer 23 has a main body 231 extending in the first direction D1 and extensions 232 protruding from the body in both the second directions D2.

This arrangement allows the antenna conductor layers 23 to be arranged appropriately in a limited space on the rear surface 202 of the substrate 2.

As shown in FIG. 2, the first high-frequency conductor layers 21 adjacent to the second high-frequency conductor layers 22 extend from the first side surface 302A in the first direction D1 and bend outward in the second directions D2 toward the second high-frequency conductor layers 22. More specifically, the first high-frequency conductor layer 21 (denoted by 21A in FIG. 2) positioned in the rightward second direction D2 and adjacent to the second high-frequency conductor layer 22 positioned in the rightward second direction D2 extends in the first direction D1 from the first side surface 302A and bends outward in the rightward second direction D2 toward the right second high-frequency conductor layer 22. In other words, the first high-frequency conductor layer 21 positioned in the rightward second direction D2 in this embodiment extends in the first direction D1 from the first side surface 302A near the inside end 211, bends in the rightward second direction D2 halfway between the inside end 211 and the outside end 212, and extends in the first direction D1 near the outside end 212. Note that the rightward second direction D2 is the rightward direction in FIG. 2.

This arrangement allows the front surface 201 of the substrate 2 to have a space for application of the adhesive 4 between the first high-frequency conductor layer 21 lying in the rightward second direction D2 and the second high-frequency conductor layer 22 lying in the rightward second direction D2.

The first high-frequency conductor layer 21 (denoted by 21A in FIG. 2) positioned in the leftward second direction D2 and adjacent to the second high-frequency conductor layer 22 positioned in the leftward second direction D2 extends in the first direction D1 from the first side surface 302A and bends outward in the second direction D2 toward the left second high-frequency conductor layer 22. In other words, the first high-frequency conductor layer 21 positioned in the leftward second direction D2 in this embodiment extends in the first direction D1 from the first side surface 302A neat the inside end 211, bends in the leftward second direction D2 halfway between the inside end 211 and the outside end 212, and extends in the first direction D1 near the outside end 212.

This arrangement allows the front surface 201 of the substrate 2 to have a space for application of the adhesive 4 between the first high-frequency conductor layer 21 lying in the leftward second direction D2 and the second high-frequency conductor layer 22 lying in the leftward second direction D2.

Between the first high-frequency conductor layer 21 lying in the rightward second direction D2 and the first high-frequency conductor layer 21 lying in the leftward second direction D2, the middle first high-frequency conductor layer 21 (denoted by 21B in FIG. 2) is positioned at the center of the width in the second directions D2, and extends straight in the first direction D1.

As shown in FIGS. 1 and 2, at least two outside ends 212 and 222 of all the high-frequency conductor layers 21 and 22 are arranged in the second directions D2 orthogonal to the first direction D1 in the plane of the front surface 201 of the substrate 2. The outside ends 212 and 222 of all the high-frequency conductor layers 21 and 22 in this embodiment are aligned in a row in the second directions D2 orthogonal to the first direction D1 in the plane of the front surface 201 of the substrate 2.

This arrangement allows the antenna conductor layers 23 to be connected to the outside ends 212 and 222 of the multiple high-frequency conductor layers 21 and 22 aligned in a row. The antenna conductor layers 23 can thus be formed to have a length regulated appropriately, enabling the antenna conductor layers 23 to be arranged compactly in a limited space.

The high-frequency conductor layers 21 and 22 on the front surface 201 of the substrate 2 are surrounded by ground conductor layers 24. The ground conductor layers 24, which surround the high-frequency conductor layers 21 and 22, are connected to ground. The ground conductor layers 24 are arranged all around the ends and both the sides of the high-frequency conductor layers 21 and 22 in the plane of the front surface 201. This arrangement reduces attenuation of high frequency signals in the high-frequency conductor layers 21 and 22. FIG. 2 illustrates the high-frequency conductor layers 21 and 22 sandwiched by the ground conductor layers 24 with their surfaces covered with resist layers 25.

To prevent undesirable attenuation of high frequency signals, the outside ends 212 and 222 of the high-frequency conductor layers 21 and 22 in this embodiment are connected to the ground conductor layers 24 as well as the antenna conductor layers 23. The outside ends 212 and 222 may also be formed as end portions 241 of the ground conductor layers 24 aligned in a row in the second directions D2.

[Other Conductor Layers 20]

As shown in FIG. 2, various conductor layers 20 other than the high-frequency conductor layers 21 and 22 are provided on the front surface 201 of the substrate 2. On the front surface 201 or the rear surface 202 of the substrate 2, electronic components are arranged and electrically connected to the semiconductor component 3. The conductor layers 20 other than the high-frequency conductor layers 21 and 22 are used to electrically connect the semiconductor component 3 and the electronic components. The conductor layers 20 other than the high-frequency conductor layers 21 and 22 are arranged on the front surface 201 of the substrate 2 in a space positioned in the third direction D3 opposite the space in the first direction D1 in which the high-frequency conductor layers 21 and 22 are arranged. In other words, the conductor layers 20 other than the high-frequency conductor layers 21 and 22 are arranged on the front surface 201 of the substrate 2 in a manner that extends outward from the third side surface 302C, which is opposite to the first side surface 302A of the semiconductor component 3, and from parts of the pair of second side surfaces 302B positioned in the third direction D3.

Figure 6:
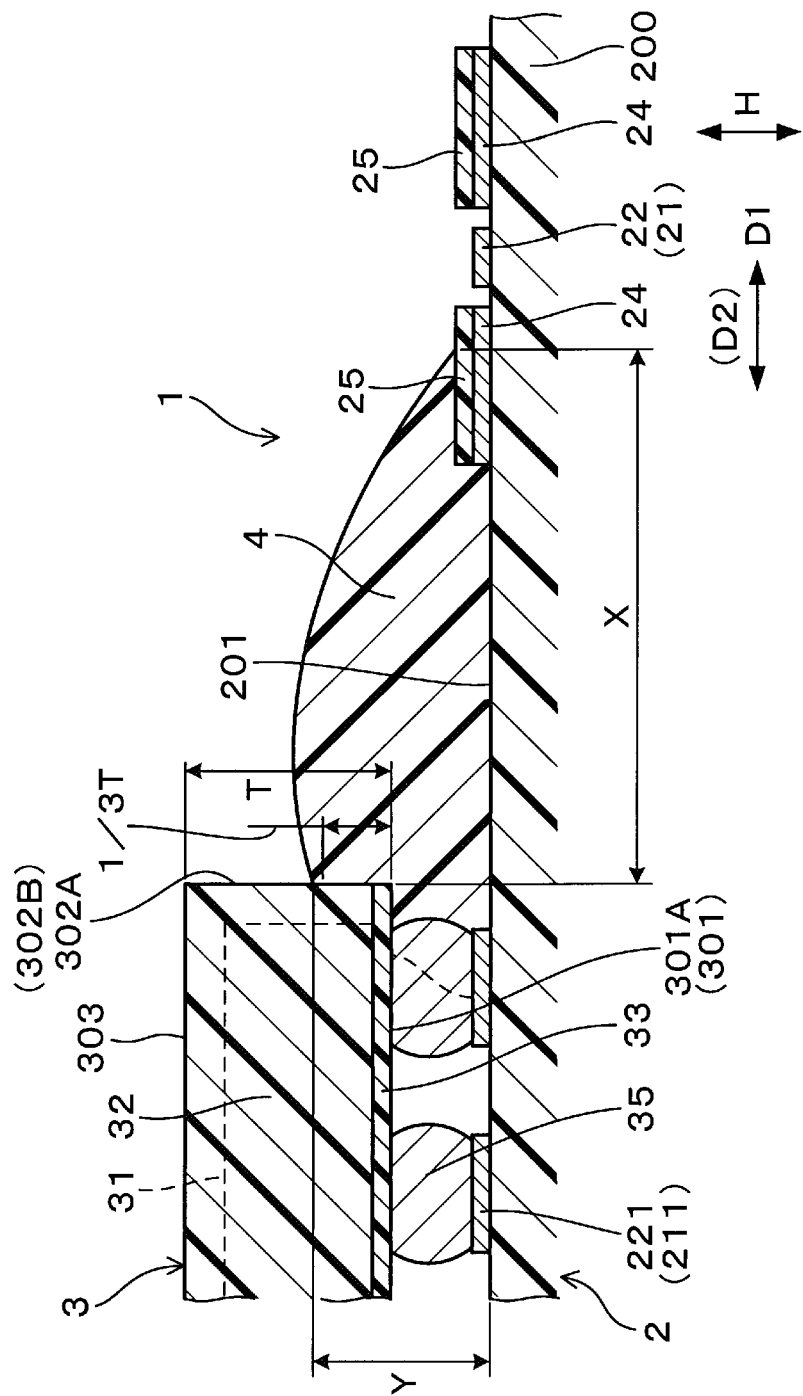
FIG. 6 is a cross-sectional view of an area including the semiconductor component, the high-frequency conductor layers, and an adhesive in the radar device according to the first embodiment.
Figure 7:
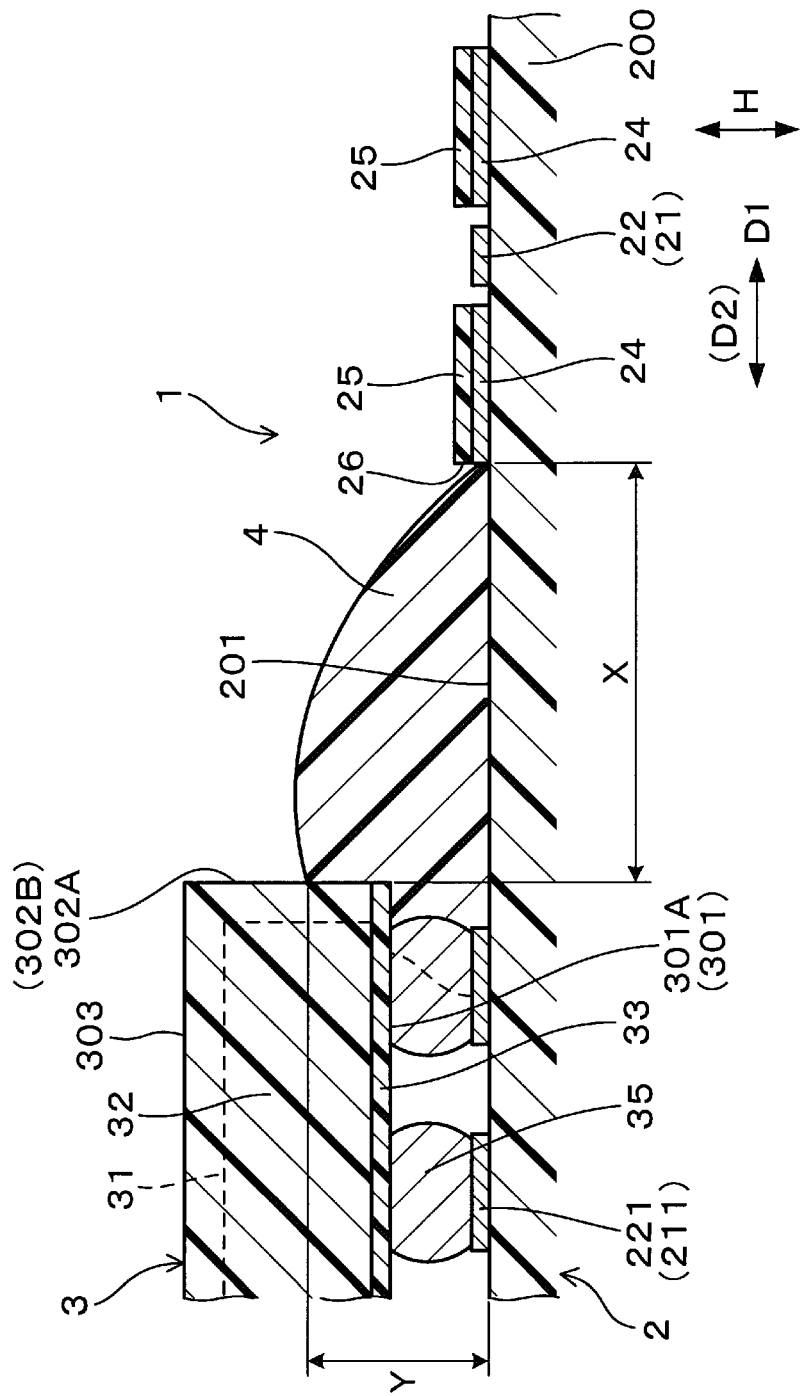
FIG. 7 is a cross-sectional view of an area including a semiconductor component, high-frequency conductor layers, and an adhesive in another radar device according to the first embodiment.
Figure 8:
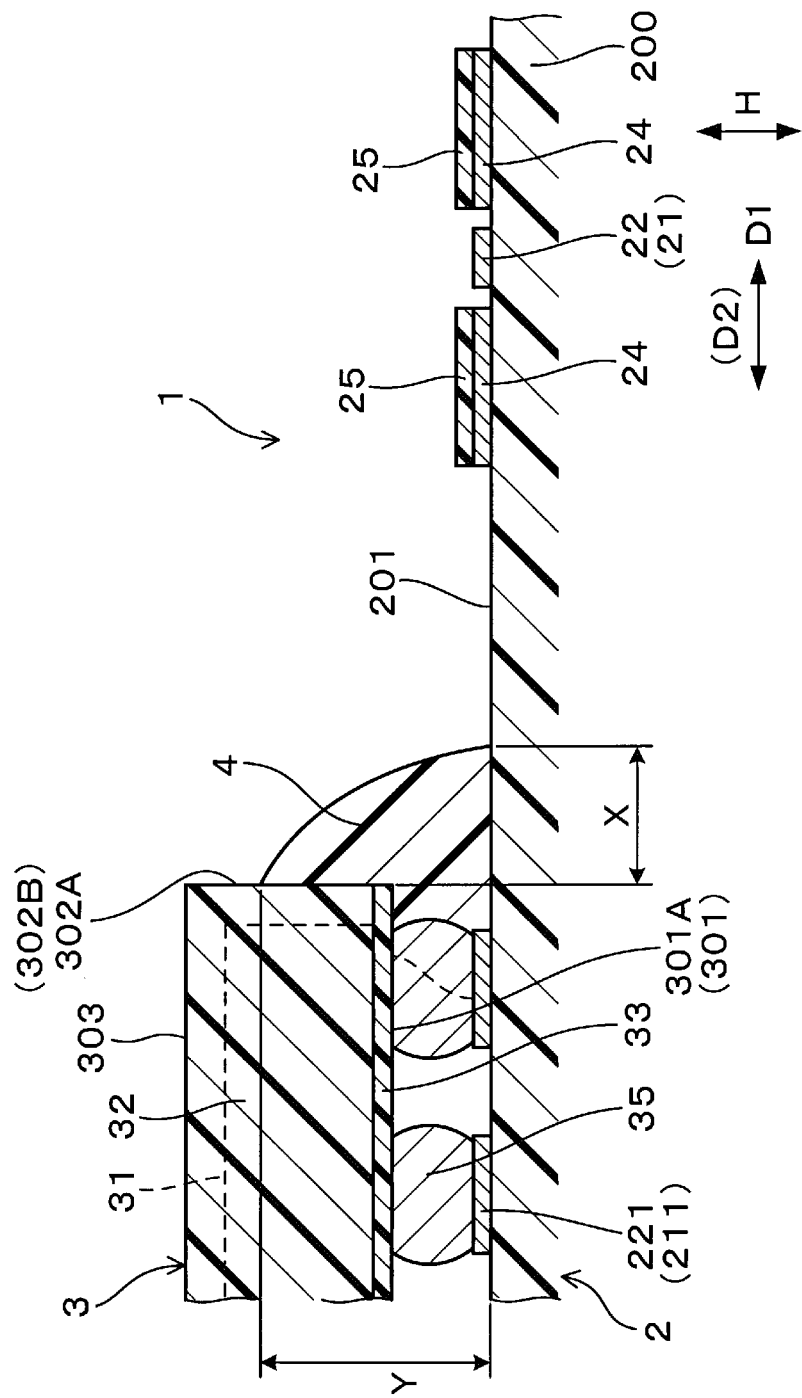
FIG. 8 is a cross-sectional view of an area including a semiconductor component, high-frequency conductor layers, and an adhesive in another radar device according to the first embodiment.

As shown in FIGS. 6 to 8, on the front surface 201 of the substrate 2, the surfaces of the conductor layers 20 other than the high-frequency conductor layers 21 and 22 and the surfaces of the ground conductor layers 24 are covered with the resist layers 25 serving as protective films that protect the copper foil forming the conductor layers 20 or the ground conductor layers 24. The surfaces of the high-frequency conductor layers 21 and 22 and the antenna conductor layers 23 are not covered with the resist layers 25 so as not to attenuate high frequency signals. FIGS. 6 to 8 are schematic cross-sectional views taken in a direction orthogonal to the first direction D1 or the second direction D2.

[Conductive Member 35]

As shown in FIGS. 6 to 8, the conductive members 35 are also referred to as bumps and are solder materials that electrically connect the conductor of the semiconductor component 3 and the conductor layers 20, 21, and 22. The conductive members 35 are provided on the conductor in the bottom surface 301 of the semiconductor component 3. When the semiconductor component 3 is disposed over the substrate 2, the conductive members 35 come into contact with the conductor layers 20, 21, and 22 of the substrate 2 and join with the conductor layers 20, 21, and 22.

[Semiconductor Component 3]

As shown in FIGS. 6 to 8, the semiconductor component 3 includes a circuit portion 31 that generates a high frequency signal, a molded resin portion 32 that is a resin covering the circuit portion 31, and a bottom resin portion 33 provided in the bottom surface 301 of the semiconductor component 3. The circuit portion 31 includes semiconductor elements serving as, for example, a synthesizer that generates a high frequency signal, a mixer that mixes a transmission wave and a reception wave, an analog-digital converter that converts an analog signal into a digital signal, and a digital signal processor that analyzes digital signals.

The bottom resin portion 33 is formed from a material different from the material for the molded resin portion 32, or specifically, a resin having an elastic modulus lower than the elastic modulus of the molded resin portion 32. The molded resin portion 32 and the bottom resin portion 33 are formed from, for example, thermosetting resins. An elastic modulus indicates an object's resistance to being deformed. An elastic modulus E is expressed by $\sigma/\varepsilon$, which is the value obtained by dividing stress $\sigma$ on an object by strain c in the object. The bottom resin portion 33, which has a low elastic modulus, is easy to deform and less likely to be held by the adhesive 4.

Figure 4:
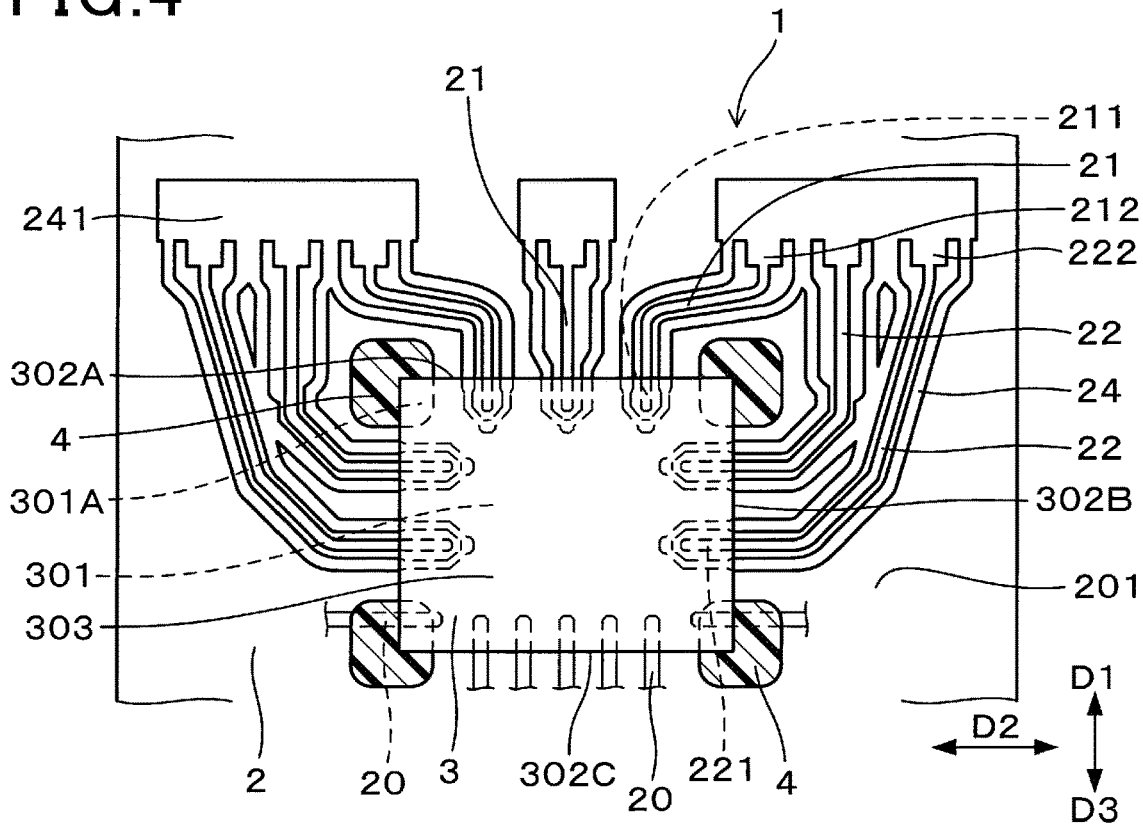
FIG. 4 is a plan view of an area including the semiconductor component, the high-frequency conductor layers, and adhesives in the radar device according to the first embodiment, showing the front surface of the substrate.

As shown in FIG. 4, the semiconductor component 3 has the shape of a rectangular solid and includes the bottom surface 301 facing the front surface 201 of the substrate 2, a top surface 303 positioned opposite the bottom surface 301, and the four side surfaces 302A, 302B, and 302C positioned between the bottom surface 301 and the top surface 303. The semiconductor component 3 has a rectangular shape, with the bottom surface 301 and the top surface 303 occupying the largest area.

The resin forming the substrate 2 has a surface roughness represented as an arithmetic average roughness Ra in the range of 0.4 to 0.6 whereas the resin forming the substrate 2 has a maximum height Rz in the range of 2 to 3 The resin forming the molded resin portion 32 of the semiconductor component 3 has an arithmetic average roughness Ra in the range of 0.6 to 1.0 whereas the resin forming the molded resin portion 32 of the semiconductor component 3 has a maximum height Rz in the range of 3 to 6 With the front surface 201 of the substrate 2 and the molded resin portion 32 of the semiconductor component 3 each having an arithmetic average roughness Ra and a maximum height Rz within the above ranges, the adhesive 4 can be applied easily to the substrate 2 and the molded resin portion 32.

[Adhesive 4]

Figure 5:
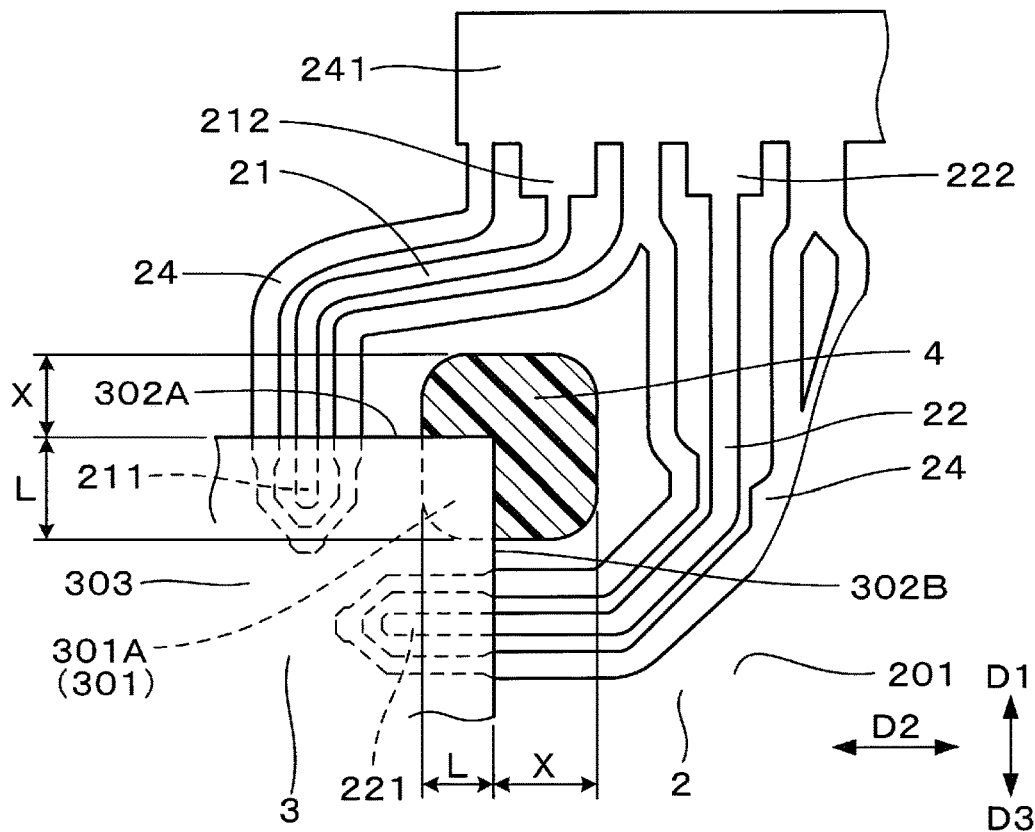
FIG. 5 is an enlarged plan view of an area including an adhesive in the radar device according to the first embodiment, showing the front surface of the substrate.

As shown in FIGS. 4 and 5, the adhesive 4 supports the conductive members 35 joining the conductor of the semiconductor component 3 to the conductor layers 20, 21, and 22 on the substrate 2, preventing the semiconductor component 3 from being displaced relative to the substrate 2. The adhesive 4 is formed from a curable resin that undergoes substantially no plastic deformation when heated. The adhesive 4 in this embodiment is made using epoxy resin as thermosetting resin. The adhesive 4 may be formed from photocurable resin. The adhesive 4 is also applied to the side surfaces 302A, 302B, and 302C of the semiconductor component 3 in order to prevent the semiconductor component 3 from being displaced relative to the substrate 2 in the plane of the front surface 201.

As shown in FIGS. 6 to 8, the adhesive 4 is provided continuously from the bottom surface 301 of the semiconductor component 3 to the side surfaces 302A, 302B, and 302C and bonds the bottom surface 301 and the side surfaces 302A, 302B, and 302C of the semiconductor component 3 to the front surface 201 of the substrate 2. In other words, the adhesive 4 is provided continuously from between the bottom surface 301 of the semiconductor component 3 and the front surface 201 of the substrate 2 to the side surfaces 302A, 302B, and 302C of the semiconductor component 3. The adhesive 4 may be in contact with the front surface 201 of the substrate 2 as well as the surfaces of the resist layers 25 protecting the conductor layers 20 on the front surface 201 of the substrate 2.

As shown in FIG. 4, the adhesive 4 in this embodiment is distributed in a manner that covers four corners 301A included in the bottom surface 301 of the semiconductor component 3. Specifically, the adhesive 4 is in contact with the four corners 301A of the bottom surface 301 of the semiconductor component 3, the side surfaces 302A, 302B, and 302C of the semiconductor component 3 that are adjacent to each of the four corners 301A, and areas on the front surface 201 of the substrate 2 that include the sites facing the four corners 301A. This arrangement achieves well-balanced application of the adhesive 4 to the semiconductor component 3 and enables the semiconductor component 3 to be supported stably relative to the substrate 2 using a small amount of adhesive 4. The adhesive 4 provided to each corner 301A of the bottom surface 301 of the semiconductor component 3 bonds the bottom surface 301 and the side surfaces 302A, 302B, and 302C of the semiconductor component 3 to the front surface 201 of the substrate 2.

Around the four corners 301A of the semiconductor component 3, the continuously applied straight adhesive 4 along one of the side surfaces 302A, 302B, and 302C in the plane of the front surface 201 of the substrate 2 has a length L falling within the range of 0.5 to 1.2 mm. With the continuously applied adhesive 4 having a length L smaller than 0.5 mm, the adhesive 4 cannot provide sufficient strength to bond the semiconductor component 3 to the substrate 2. With the continuously applied adhesive 4 having a length L greater than 1.2 mm, the widely provided adhesive 4 makes it difficult to place the semiconductor component 3 and the conductor layers 20, 21, and 22 in a limited space.

The adhesive 4 is not in contact with the high-frequency conductor layers 21 and 22, with a gap of 0.1 mm or more formed between the adhesive 4 and the high-frequency conductor layers 21 and 22. With the adhesive 4 and the high-frequency conductor layers 21 and 22 having a gap of less than 0.1 mm, high frequency signals may attenuate.

As shown in FIGS. 4 and 5, a portion of the adhesive 4 is in contact with an area on the front surface 201 of the substrate 2 excluding the sites of the multiple formed high-frequency conductor layers 21 and 22 and sandwiched between the first high-frequency conductor layer 21 and the second high-frequency conductor layer 22, and continues to the side surfaces 302A and 302B of the semiconductor component 3. This arrangement allows the adhesive 4 to be provided at an appropriate position not in contact with the high-frequency conductor layers 21 and 22 on the front surface 201 of the substrate 2.

A portion of the adhesive 4 is in contact with an area on the front surface 201 excluding the sites of the multiple formed high-frequency conductor layers 21 and 22, including the site facing a corner 301A of the bottom surface 301 of the semiconductor component 3, and sandwiched between the first high-frequency conductor layer 21 and the second high-frequency conductor layer 22, and continues to the side surfaces 302A and 302B of the semiconductor component 3 that are adjacent to the corner 301A. The contact of the portion of the adhesive 4 with the side surfaces 302A and 302B adjacent to the corner 301A of the semiconductor component 3 can effectively prevent the semiconductor component 3 from being displaced relative to the substrate 2 in the plane of the front surface 201.

As shown in FIGS. 6 to 8, in order to effectively prevent the semiconductor component 3 from being displaced relative to the substrate 2 in the plane of the front surface 201, the adhesive 4 is preferably provided from the bottom surface 301 of the semiconductor component 3 up to a highest possible position in the height direction H on the side surfaces 302A, 302B, and 302C of the semiconductor component 3. When the semiconductor component 3 has a thickness T in the height direction H orthogonal to the bottom surface 301, the adhesive 4 is in contact with the side surfaces from the bottom surface 301 to a thickness within the range of ⅓ T to T inclusive. This arrangement can effectively prevent the semiconductor component 3 from being displaced relative to the substrate 2 in the plane of the front surface 201.

When the adhesive 4 is in contact with the side surface 302A, 302B, or 302C in the height direction H from the bottom surface 301 to a thickness of less than ⅓ T of the side surface, the semiconductor component 3 cannot sufficiently be prevented from being displaced relative to the substrate 2 in the plane of the front surface 201.

Figure 9:
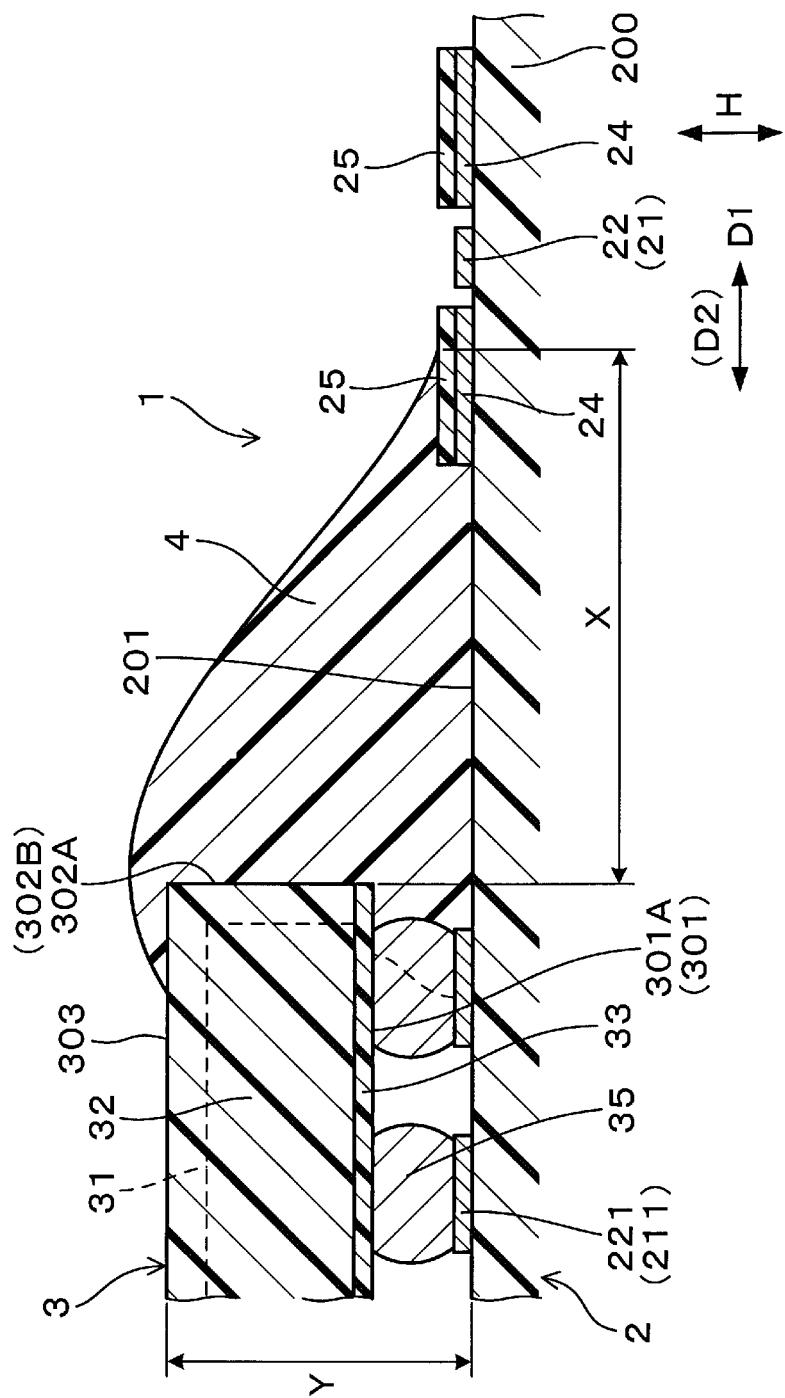
FIG. 9 is a cross-sectional view of an area including a semiconductor component, high-frequency conductor layers, and an adhesive in another radar device according to the first embodiment.

As shown in FIG. 9, the adhesive 4 may be in continuous contact in the height direction H with the entire side surfaces 302A, 302B, and 302C of the semiconductor component 3, or in other words, the side surfaces 302A, 302B, and 302C, the bottom surface 301, and the top surface 303 of the semiconductor component 3. The adhesive 4 may continue from the side surfaces 302A, 302B, and 302C of the semiconductor component 3 to the top surface 303 of the semiconductor component 3.

The adhesive 4 is in contact with the bottom resin portion 33 positioned in the bottom surface 301 and the side surfaces 302A, 302B, and 302C of the semiconductor component 3, and the molded resin portion 32 positioned in the side surfaces of the semiconductor component 3. The bottom resin portion 33 in the semiconductor component 3 is thin. The bottom resin portion 33 is provided in an area ranging from the bottom surface 301 to a thickness of less than ⅓ T of the side surfaces 302A, 302B, and 302C.

The bottom resin portion 33, which has a low elastic modulus, is easy to deform and less likely to be held by the adhesive 4. In contrast, the molded resin portion 32, which has an elastic modulus higher than that of the bottom resin portion 33, is more likely to be held by the adhesive 4 than the bottom resin portion 33. Thus, the contact of the adhesive 4 with the molded resin portion 32 as well as the bottom resin portion 33 can enhance the effect of the adhesive 4 holding the semiconductor component 3.

The adhesive 4 in this embodiment has a viscosity maximized to prevent easy spreading on the front surface 201 of the substrate 2 in order to raise the holding range up to a highest possible position on the side surfaces 302A, 302B, and 302C of the semiconductor component 3. In the present embodiment, to indicate that the adhesive 4 is less likely to spread horizontally and accumulates vertically, the aspect ratio of the adhesive 4 is defined using the dimension in the height direction H and the dimension in the first direction D1 or the second direction D2.

A typical aspect ratio is expressed as the ratio between a horizontal dimension and a vertical dimension in cross section. However, the adhesive 4 is provided locally on the bottom surface 301 and the side surfaces 302A, 302B, and 302C of the semiconductor component 3. Further, the aspect ratio varies in different cross sections of the adhesive 4. Thus, the aspect ratio of the adhesive 4 is expressed by, instead of using cross-sectional values, the ratio between the maximum dimensions in the height direction H and the first direction D1 or the second direction D2. Along the entire length of the adhesive 4 in the height direction H, the maximum dimension in the height direction H is taken at the site of the adhesive 4 in contact with the side surface 302A, 302B, or 302C, and the maximum dimension in the first direction D1 or the second direction D2 is taken from the entire lateral length of the adhesive 4.

As shown in FIGS. 6 to 8, the aspect ratio Y/X of the adhesive 4 is defined as described below. The lateral dimension of the adhesive 4 is defined as the maximum width X of the site of the adhesive 4 in contact with the front surface 201 of the substrate 2, from the side surface 302A, 302B, or 302C of the semiconductor component 3 to the end in the first direction D1 or the second direction D2 orthogonal to the side surface 302A, 302B, or 302C. At the site of the adhesive 4 in contact with the side surface 302A, 302B, or 302C of the semiconductor component 3, the maximum height from the bottom surface 301 of the semiconductor component 3 in the height direction H orthogonal to the bottom surface 301 is denoted by Y.

The aspect ratio Y/X of the adhesive 4 is equal to or greater than 0.3. The aspect ratio Y/X equal to 0.3 represents the value of the limitation within which the adhesive 4 may spread on the front surface 201. When the aspect ratio Y/X of the adhesive 4 is smaller than 0.3, the adhesive 4 is difficult to provide up to a highest possible position on the side surfaces 302A, 302B, and 302C of the semiconductor component 3. The aspect ratio Y/X of the adhesive 4 is preferably equal to or greater than 1.

As shown in FIG. 8, the adhesive 4 may have the maximum height Y in the height direction H at the site in contact with the side surface 302A, 302B, or 302C of the semiconductor component 3. As shown in FIG. 6 or 7, the adhesive 4 may be highest in the height direction H at a site apart from the site in contact with the side surface 302A, 302B, or 302C of the semiconductor component 3. Also in this case, the maximum height Y of the adhesive 4 is defined as the maximum height at the site in contact with the side surface 302A, 302B, or 302C of the semiconductor component 3.

The aspect ratio Y/X of the adhesive 4 can increase with increasing viscosity of the adhesive 4 applied to the substrate 2 and the semiconductor component 3. The viscosity of the adhesive 4 may fall within the range of, for example, 217 to 743 Pas. The adhesive 4 contains resin components and filler as filling materials. The viscosity of the adhesive 4 is adjusted by adjusting the filler content of the adhesive 4. More specifically, the viscosity of the adhesive 4 becomes higher as the filler content of the adhesive 4 increases.

The thixotropic value of the adhesive 4 may be equal to or greater than 3.1 as a value according to JIS K6800. Thixotropy, or a thixotropic property, is an index indicating the property of becoming less viscous when agitated and becoming more viscous when allowed to stand after the agitation. Thixotropy is expressed as the viscosity ratio between two states with different revolutions of agitation, and a higher thixotropic value indicates that agitation changes viscosity more significantly. A thixotropic value for maintaining sufficient fluidity is equal to or smaller than 4.1.

FIGS. 6 to 9 illustrate the attachment of the semiconductor component 3 to the substrate 2 with adhesives 4 having different viscosities and thus different aspect ratios. In FIG. 6, the aspect ratio Y/X of the adhesive 4 is slightly greater than 0.3, and the adhesive 4 is in contact with a wide range on the front surface 201 of the substrate 2 from the bottom surface 301 of the semiconductor component 3 and the side surfaces 302A, 302B, and 302C. In FIG. 9, the adhesive 4 is provided over the entire side surfaces 302A, 302B, and 302C of the semiconductor component 3 in the height direction H, covering the semiconductor component 3 from the bottom surface 301 to the height of the top surface 303. In FIGS. 6 and 9, the adhesive 4 reaches the surface of the resist layer 25 on the ground conductor layer 24 surrounding the high-frequency conductor layers 21 and 22.

In FIG. 7, the aspect ratio Y/X of the adhesive 4 is about 0.5, and the adhesive 4 is dammed by the ground conductor layer 24 surrounding the high-frequency conductor layers 21 and 22 on the front surface 201 of the substrate 2. In this case, a part of the adhesive 4 is dammed by a barrier 26 formed by the edge of the ground conductor layer 24 and the edge of the resist layer 25 on the front surface 201 of the substrate 2, near the corner 301A of the bottom surface 301 of the semiconductor component 3. This arrangement controls the spreading of the adhesive 4 on the front surface 201 of the substrate 2 and prevents the adhesive 4 from coming into contact with the high-frequency conductor layers 21 and 22.

In FIG. 8, the aspect ratio Y/X of the adhesive 4 is about 2, and the adhesive 4 is provided up to a highest possible position on the side surfaces 302A, 302B, and 302C of the semiconductor component 3. This arrangement also prevents the adhesive 4 from coming into contact with the high-frequency conductor layers 21 and 22.

Figure 10:
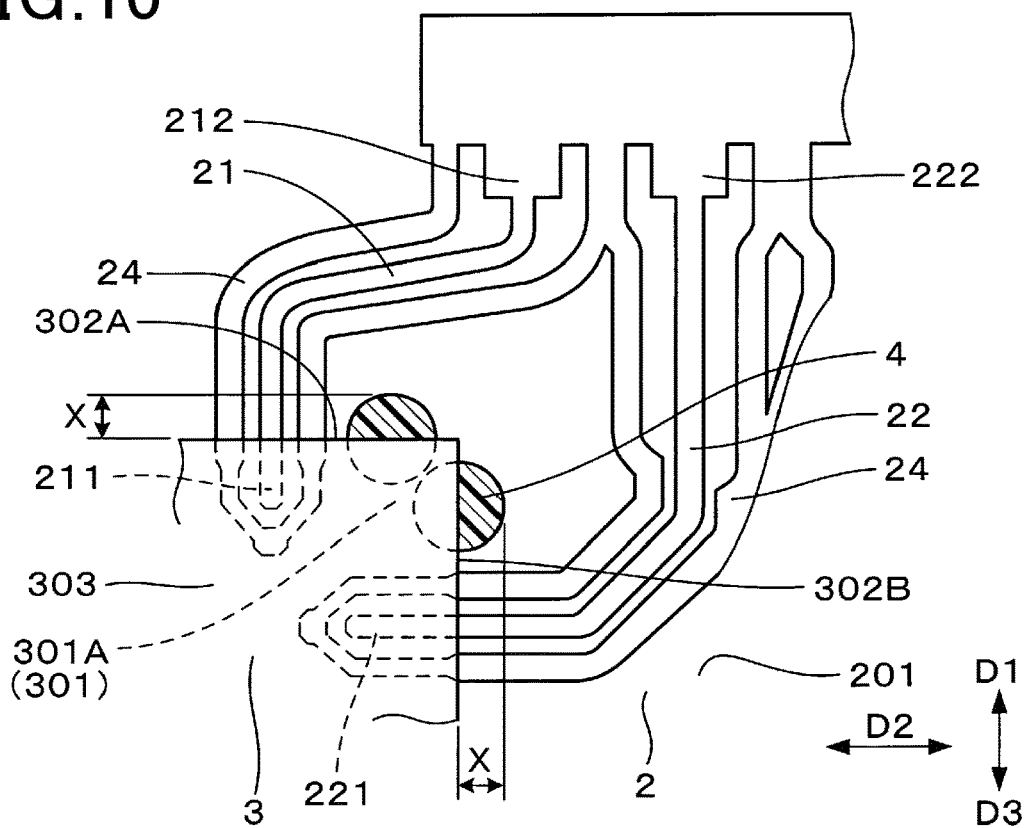
FIG. 10 is an enlarged plan view of an area including adhesives in another radar device according to the first embodiment, showing the front surface of the substrate.

The adhesive 4 may not be distributed in a manner that covers the four corners 301A of the bottom surface 301 of the semiconductor component 3. As shown in FIG. 10, the adhesive 4 may be divided and provided to the bottom surface 301 and the side surfaces 302A and 302B at both sides of each of the four corners 301A of the bottom surface 301 of the semiconductor component 3. Furthermore, for example, an inkjet printer may be used to form protruding defensive walls around the sites on the front surface 201 of the substrate 2 that face the four corners 301A of the bottom surface 301 of the semiconductor component 3. The protruding defensive walls have the shape of dams (surrounding the corners 301A) and prevent the adhesive 4 from flowing out. The adhesive 4 may be poured into the inside of the protruding defensive walls.

[Application of Adhesive 4]

In the present embodiment, to prevent the adhesive 4 from adhering to the high-frequency conductor layers 21 and 22, the adhesive 4 is applied to the substrate 2 and the semiconductor component 3 in an advantageous manner. After the conductive members 35 provided on the bottom surface 301 of the semiconductor component 3 are joined to the conductor layers 20, 21, and 22 on the substrate 2, the adhesive 4 is ejected from a nozzle and applied to an area on the substrate 2 close to the semiconductor component 3.

To eliminate the problem of stringing of the adhesive 4 from the tip of the nozzle during the application of the adhesive 4, the stringlike matter may be dropped onto the adhesive 4 by temporarily retracting the nozzle above the adhesive 4 after the application of the adhesive 4 from the nozzle. This enables the stringlike matter of the adhesive 4 to be not in contact with the high-frequency conductor layers 21 and 22. The arrangement in which the adhesive 4 is not in contact with the high-frequency conductor layers 21 and 22 can reduce attenuation of high frequency signals in the high-frequency conductor layers 21 and 22, or in other words, conductor loss in the high-frequency conductor layers 21 and 22.

To reduce uneven application, the application of the adhesive 4 ejected from the nozzle may be started from an area nearer to the high-frequency conductor layers 21 and 22.

[Difference Between Linear Expansion Coefficients]

The radar device 1 includes components such as the substrate 2, the conductor layers 20, 21, and 22, the semiconductor component 3, the conductive members 35, and the adhesive 4, which are formed from different materials and have different linear expansion coefficients. In a process in which the radar device 1 is heated and cooled, the differences between the linear expansion coefficients of the components cause thermal stresses, which affect the semiconductor component 3.

[Functional Effects]

In the radar device 1 according to this embodiment, the high-frequency conductor layers 21 and 22 and the adhesive 4 may be arranged relative to the semiconductor component 3 in an advantageous manner.

The multiple overall second high-frequency conductor layers 22 extend from the second side surfaces 302B of the semiconductor component 3 outward in the second directions D2, bend in the first direction D1 of the front surface 201 of the substrate 2, and extend in the first direction D1 beyond the first side surface 302A of the semiconductor component 3. The outside ends 212 of all the first high-frequency conductor layers 21 and the outside ends 222 of all the second high-frequency conductor layers 22 are arranged in the first direction D1 from the first side surface 302A of the semiconductor component 3 and aligned in a row in the second directions D2.

The arrangement allows attenuation of high frequency signals to be reduced by minimizing the length of the multiple high-frequency conductor layers 21 and 22 formed, and allows the size of the device to be reduced by arranging the multiple high-frequency conductor layers 21 and 22 compactly.

The adhesive 4 is in contact with the four corners 301A of the bottom surface 301 of the semiconductor component 3 and the side surfaces 302A, 302B, and 302C adjacent to the four corners 301A, and in contact with the front surface 201 of the substrate 2 except for the sites of the multiple high-frequency conductor layers 21 and 22 formed. This arrangement enables the adhesive 4 to hold the side surfaces 302A, 302B, and 302C of the semiconductor component 3 even when the semiconductor component 3 is affected by thermal stresses due to the differences between the linear expansion coefficients of the components such as the substrate 2, the conductor layers 20, 21, and 22, the semiconductor component 3, the conductive members 35, and the adhesive 4. Thus, the semiconductor component 3 cannot be displaced relative to the substrate 2 in a direction parallel to the front surface 201 of the substrate 2, preventing cracking from occurring in, for example, the conductive members 35. This can extend the life of the conductive members 35, which are formed from solder.

Accordingly, the radar device 1 according to the present embodiment allows appropriate arrangement of the high-frequency conductor layers 21 and 22 and the adhesive 4 relative to the semiconductor component 3 in order to reduce attenuation of high frequency signals, the size of the device, and thermal stress cracking.

The radar device 1 according to the present embodiment is installed on a vehicle as an on-vehicle radar monitoring system. On a vehicle, there is a stronger desire for reductions in the size of the radar device 1 so as not to interfere with other installed parts. On a vehicle, the radar device 1 in which the high-frequency conductor layers 21 and 22 and the adhesive 4 are arranged appropriately provides its functional effects more significantly. On a vehicle, the radar device 1 is affected more greatly by heat or vibration, and thus the effect of preventing cracking from occurring in, for example, the conductive members 35 appears more clearly.

Second Embodiment

A radar device 1 according to the present embodiment includes high-frequency conductor layers 21 and 22 and an adhesive 4 arranged differently from those in the first embodiment.

Figure 11:
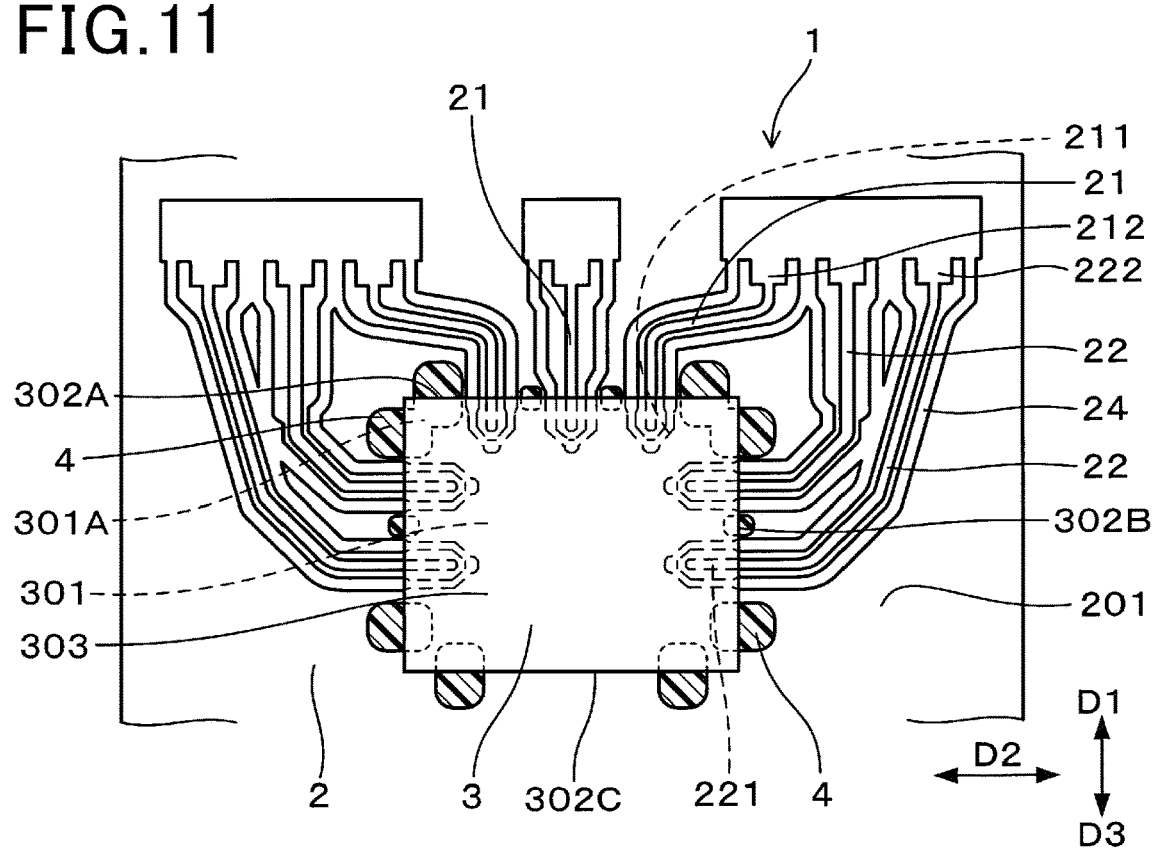
FIG. 11 is a plan view of an area including a semiconductor component, high-frequency conductor layers, and adhesives in a radar device according to a second embodiment, showing the front surface of its substrate.

As shown in FIG. 11, the adhesive 4 may be provided to areas except for the four corners 301A of the bottom surface 301 of the semiconductor component 3. Also in this case, the adhesive 4 is applied to the bottom surface 301 and the side surfaces 302A, 302B, and 302C of the semiconductor component 3 and the front surface 201 of the substrate 2. In this case, the application of the adhesive 4 may be facilitated by reducing the usage of the adhesive 4.

The adhesive 4 may be provided to the four corners 301A of the bottom surface 301 of the semiconductor component 3 and the four sides of the bottom surface 301 of the semiconductor component 3, except for the sites of the high-frequency conductor layers 21 and 22 formed. Also in this case, the adhesive 4 is applied to the bottom surface 301 and the side surfaces 302A, 302B, and 302C of the semiconductor component 3 and the front surface 201 of the substrate 2. In this case, the adhesive 4 can bond the semiconductor component 3 to the substrate 2 more firmly.

Figure 12:
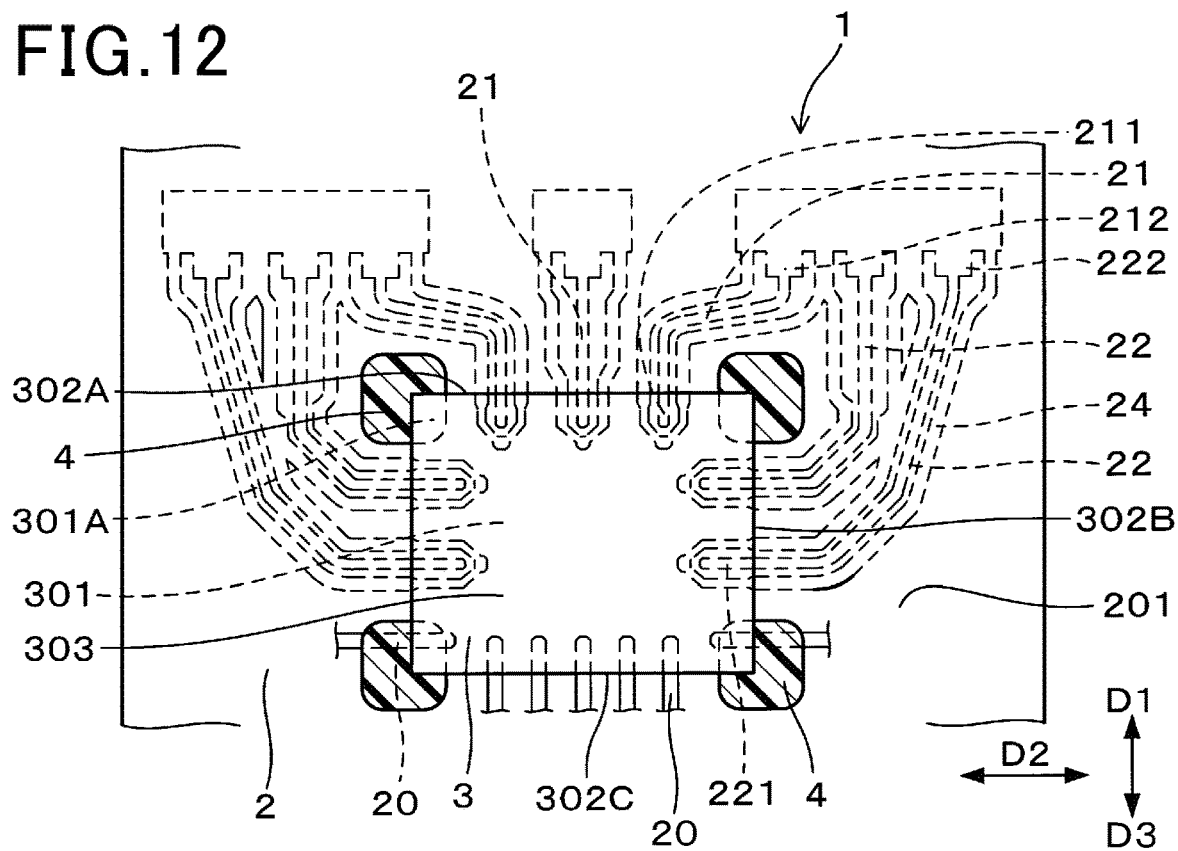
FIG. 12 is a plan view of an area including a semiconductor component, high-frequency conductor layers, and adhesives in another radar device according to the second embodiment, showing the front surface of the substrate.

As shown in FIG. 12, the high-frequency conductor layers 21 and 22 may be provided on the rear surface 202 of the substrate 2. In this case, the conductive members 35 on the bottom surface 301 of the semiconductor component 3 are electrically connected to the high-frequency conductor layers 21 and 22 on the rear surface 202 of the substrate 2 via the conductors in through holes formed in the substrate 2. In this case, the antenna conductor layers 23 may be provided on the front surface 201 of the substrate 2. Also in this case, the adhesive 4 is applied to the bottom surface 301 and the side surfaces 302A, 302B, and 302C of the semiconductor component 3 and the front surface 201 of the substrate 2. This structure gives additional space on the front surface 201 of the substrate 2 and increases the flexibility in the arrangement of elements such as the antenna conductor layers 23.

Figure 13:
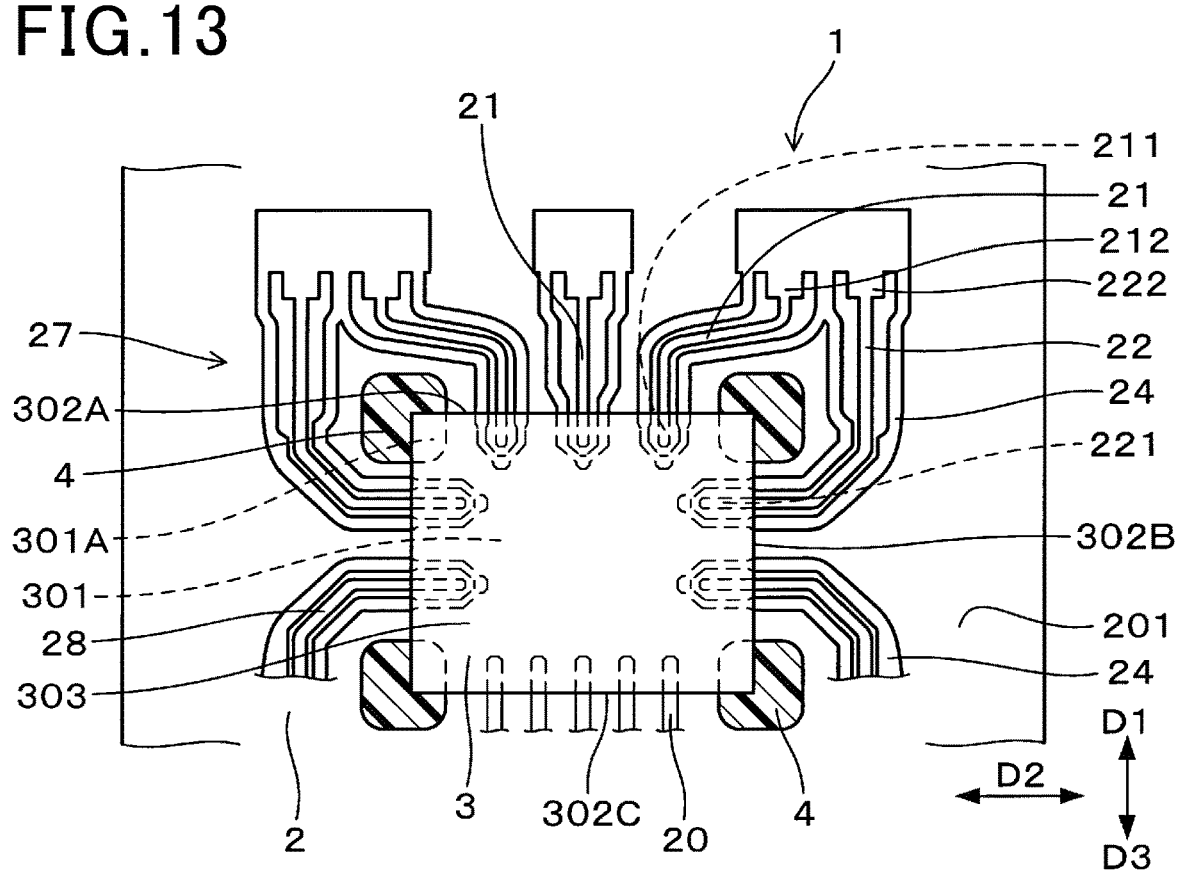
FIG. 13 is a plan view of an area including a semiconductor component, high-frequency conductor layers, and adhesives in another radar device according to the second embodiment, showing the front surface of the substrate.

As shown in FIG. 13, the multiple high-frequency conductor layers 21 and 22 include high-frequency conductor layers 28, which may not be provided in the first direction D1 on the front surface 201 and the rear surface 202 of the substrate 2. In this case, a high-frequency conductor layer set 27 of multiple high-frequency conductor layers 21 and 22 may be provided in the first direction D1 on the front surface 201 or the rear surface 202 of the substrate 2, whereas the remaining high-frequency conductor layers 28 may be provided in the second direction D2 or the third direction D3 on the front surface 201 or the rear surface 202 of the substrate 2. The outside ends 212 and 222 of the high-frequency conductor layers 21 and 22 included in the high-frequency conductor layer set 27 may be arranged in the first direction D1 from the first side surface 302A of the semiconductor component 3, whereas the outside ends of the remaining high-frequency conductor layers 28 may be arranged in the third direction D3 from the first side surface 302A. This structure may increase the flexibility in the arrangement of elements such as the high-frequency conductor layers 21, 22, and 28 and the antenna conductor layers 23.

The other components and the functional effects of the radar device 1 according to the present embodiment are the same as in the first embodiment. Also in this embodiment, the same reference numerals as used in the first embodiment indicate the same components as those in the first embodiment.

The radar device 1 may be installed at multiple positions in a vehicle. In this case, multiple radar devices 1 may be used to form an on-vehicle radar monitoring system. The radar device 1 may not be used for a vehicle, but may be used for other means of transportation such as a train or an aircraft.

The present disclosure is not limited to the embodiments, but may be implemented in different embodiments without departing from the spirit and scope thereof. The present disclosure encompasses various modifications and alterations that fall within the range of equivalence. The configurations in embodiments may also be combined. Additionally, various combinations and forms of components contemplated from the present disclosure also fall within the technical scope of the disclosure.

What is claimed is:

1. A radar device comprising:
   a substrate including a plurality of conductor layers arranged on a front surface or a rear surface, the plurality of conductor layers comprising a plurality of high-frequency conductor layers for transferring a high frequency signal;
   a semiconductor component facing the front surface of the substrate, being in contact with the plurality of conductor layers on the substrate via conductive members, and configured to generate a high frequency signal; and
   an adhesive configured to bond the semiconductor component to the front surface of the substrate, wherein
   the semiconductor component has a bottom surface and a plurality of side surfaces including a first side surface facing in a first direction from a central portion to an edge in a plane of the front surface or the rear surface of the substrate,
   all the plurality of high-frequency conductor layers or a high-frequency conductor layer set included in the plurality of high-frequency conductor layers includes at least high-frequency conductor layers that bend in the plane of the front surface or the rear surface of the substrate and thereby extends, on the front surface or the rear surface of the substrate, from inside ends facing the bottom surface of the semiconductor component to outside ends positioned in the first direction from the first side surface of the semiconductor component, and the adhesive is in contact with the front surface of the substrate except for sites of the plurality of high-frequency conductor layers formed and in contact with the plurality of side surfaces of the semiconductor component.

2. The radar device according to claim 1, wherein the plurality of high-frequency conductor layers include:

one or more first high-frequency conductor layers extending from the first side surface of the semiconductor component in the first direction, and one or more second high-frequency conductor layers extending from a pair of second side surfaces of the semiconductor component orthogonal to the first side surface of the semiconductor component, outward in second directions orthogonal to the first direction in the plane of the front surface of the substrate, and bending in the first direction, wherein the outside ends of all the one or more first high-frequency conductor layers and the second one or more high-frequency conductor layers are positioned in the first direction from the first side surface of the semiconductor component.

3. The radar device according to claim 1, wherein the plurality of high-frequency conductor layers or the high-frequency conductor layer set includes:

one or more first high-frequency conductor layers extending from the first side surface of the semiconductor component in the first direction, and one or more second high-frequency conductor layers extending from a pair of second side surfaces of the semiconductor component orthogonal to the first side surface of the semiconductor component, outward in second directions orthogonal to the first direction in the plane of the front surface of the substrate, and bending in the first direction, wherein excluding the sites of the plurality of high-frequency conductor layers, a portion of the adhesive is in contact with an area on the front surface of the substrate, an area sandwiched between adjacent ones of the one or more first high-frequency conductor layers, and the one or more second high-frequency conductor layers, and continues to a respective side surfaces of the semiconductor component.

4. The radar device according to claim 2, wherein the first high-frequency conductor layers adjacent to the second high-frequency conductor layers extend from the first side surface of the semiconductor component in the first direction and bend outward in the second directions toward the second high-frequency conductor layers, and excluding the sites of the plurality of high-frequency conductor layers, a portion of the adhesive is in contact with an area on the front surface of the substrate, including a site facing a corner of the bottom surface of the semiconductor component, and sandwiched between adjacent ones of the one or more first high-frequency conductor layers and the one or more second high-frequency conductor layers, and continues to respective side surfaces of the semiconductor component adjacent to the corner.

5. The radar device according to claim 1, wherein the outside ends of the plurality of high-frequency conductor layers or the high-frequency conductor layer set include at least outside ends aligned in a direction orthogonal to the first direction in the plane of the front surface of the substrate.

6. The radar device according to claim 1, wherein the semiconductor component includes a circuit portion configured to generate the high frequency signal, a molded resin portion comprising a first resin covering the circuit portion, and a bottom resin portion provided on the bottom surface of the semiconductor component and comprising a material different from a material for the molded resin portion, and comprising a second resin having an elastic modulus lower than an elastic modulus of the molded resin portion, and the adhesive is in contact with the bottom resin portion positioned on the bottom surface and the side surfaces of the semiconductor component, and the molded resin portion positioned on the side surfaces of the semiconductor component.

7. The radar device according to claim 1, wherein the outside ends of the plurality of high-frequency conductor layers are connected to antenna conductor layers provided on the front surface or the rear surface of the substrate.

8. The radar device according to claim 1, wherein on the front surface of the substrate, the conductor layers other than the plurality of high-frequency conductor layers each include, on a surface thereof, a resist layer for protecting the conductor layer, and at least a part of the adhesive is dammed by a barrier comprising an edge of the conductor layer and an edge of the resist layer on the front surface of the substrate, near a corner of the bottom surface of the semiconductor component.

9. The radar device according to claim 1, wherein when the semiconductor component has a thickness T in a direction orthogonal to the bottom surface, the adhesive is in contact with at least one of the plurality of side surfaces from the bottom surface to a thickness equal to or greater than ⅓ T.

10. The radar device according to claim 1, wherein when the adhesive has a site in contact with the front surface of the substrate having a maximum width X from the side surface of the semiconductor component to an end in a direction orthogonal to the side surface, and the adhesive has a site in contact with the side surface of the semiconductor component having a maximum height Y from the bottom surface of the semiconductor component in a direction orthogonal to the bottom surface, the adhesive has an aspect ratio Y/X equal to or greater than 0.3.

11. The radar device according to claim 1, wherein the semiconductor component has a shape of a rectangular solid, and the adhesive is in contact with four corners of the bottom surface of the semiconductor component, the side surfaces of the semiconductor component adjacent to each of the four corners, and areas on the front surface of the substrate including sites facing the four corners.

12. The radar device according to claim 1, wherein the outside ends of all the plurality of high-frequency conductor layers are aligned in a direction orthogonal to the first direction in the plane of the front surface of the substrate.

13. A vehicle equipped with the radar device according to claim 1.

14. A radar monitoring system comprising the radar device according to claim 1.

\* \* \* \* \*